(12) United States Patent
Ozawa et al.

(10) Patent No.: US 7,978,939 B2
(45) Date of Patent: Jul. 12, 2011

(54) OPTICAL MODULE

(75) Inventors: Hideaki Ozawa, Ebina (JP); Kenji Yamazaki, Ebina (JP); Tomoki Umezawa, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 114 days.

(21) Appl. No.: 12/140,052

(22) Filed: Jun. 16, 2008

(65) Prior Publication Data

US 2009/0092357 A1 Apr. 9, 2009

(30) Foreign Application Priority Data

Oct. 3, 2007 (JP) ................................. 2007-260147

(51) Int. Cl.
*G02B 6/12* (2006.01)
*G02B 6/36* (2006.01)
(52) U.S. Cl. .......................................... 385/14; 385/88
(58) Field of Classification Search .................. 385/14, 385/89; 398/139, 141
See application file for complete search history.

(56) References Cited

U.S. PATENT DOCUMENTS

| 5,675,684 | A  | * | 10/1997 | Hirataka et al. | ................ | 385/88 |
| 7,474,815 | B2 | * | 1/2009 | Budd et al. | ....................... | 385/14 |
| 2003/0185484 | A1 | * | 10/2003 | Chakravorty et al. | .......... | 385/14 |
| 2005/0141823 | A1 | * | 6/2005 | Han et al. | ........................ | 385/89 |

FOREIGN PATENT DOCUMENTS

JP 2005-265885 A 9/2005

OTHER PUBLICATIONS

"Packaging Perspective Toward Intra-Board Optical Interconnection", J. of Electronics Packaging, 2005, pp. 29-32, No. 1, vol. 8.

* cited by examiner

*Primary Examiner* — Uyen-Chau N Le
*Assistant Examiner* — Kajli Prince
(74) *Attorney, Agent, or Firm* — Sughrue Mion, PLLC

(57) ABSTRACT

An optical module comprises: an optical element array comprising plural optical elements that emits or receives light; and an optical waveguide comprising a clad and plural cores respectively with optical path changing portions, the cores being disposed in the clad with an interval. The optical path changing portions are optically connected to the optical elements. The optical path changing portions are arranged in a first direction having an angle with respect to a formation direction of the cores, the first direction being corresponding to an arrangement direction of said plurality of optical elements.

5 Claims, 7 Drawing Sheets

OPTICAL MODULE

CROSS-REFERENCE TO RELATED APPLICATIONS

This application is based on and claims priority under 35 USC 119 from Japanese Patent Application No. 2007-260147 filed Oct. 3, 2007.

BACKGROUND (i) Technical Field

The present invention relates to an optical module.

(ii) Related Art

Generally, an electronic device includes plural elements in many cases. For example, a copier includes an image inputting unit and an image outputting unit. In the copier, image data input from the image inputting unit is sent to the image outputting unit through an electrical cable to be printed on a printing medium such as a paper sheet.

In recent years, with development of high capability of an electronic device, a volume of transmission capacity between devices has been increased. In order to deal with the high capacity using a known parallel transmission method, a method of increasing the number of channels or a method of speeding up synchronous clock can be taken into consideration. However, an error caused due to skew between channels caused by a difference of a wiring length or a decrease in timing margin may easily occur. Accordingly, in order to solve this problem, a serial transmission method of transmitting data signals through one transmission path has become attracted.

However, since a transmission rate increases in the serial transmission method, it is difficult to embody signal transmission while maintaining good signal quality in an electrical cable by nature. As a technique for solving such a problem, a method of using an optical signal which can perform broadband signal transmission has been under examination.

SUMMARY

According to an aspect of the invention, there is provided an optical module comprising: an optical element array comprising plural optical elements that emits or receives light; and an optical waveguide comprising a clad and plural cores respectively with optical path changing portions, the cores being disposed in the clad with an interval, wherein the plural optical path changing portions are optically connected to the plural optical elements, and the plural optical path changing portions are arranged in a first direction having an angle with respect to a formation direction of the cores, the first direction being corresponding to an arrangement direction of the plural optical elements.

BRIEF DESCRIPTION OF THE DRAWINGS

Exemplary embodiments of the present invention will be described in detail based on the following figure, wherein:

FIGS. 1A and 1B are diagrams illustrating an optical module according to a first exemplary embodiment of the invention, in which FIG. 1A is a side view illustrating the optical module and FIG. 1B is a partly expanded view illustrating an optical waveguide;

DETAILED DESCRIPTION

First Exemplary Embodiment (Configuration of Optical Module)

Figure 1A:
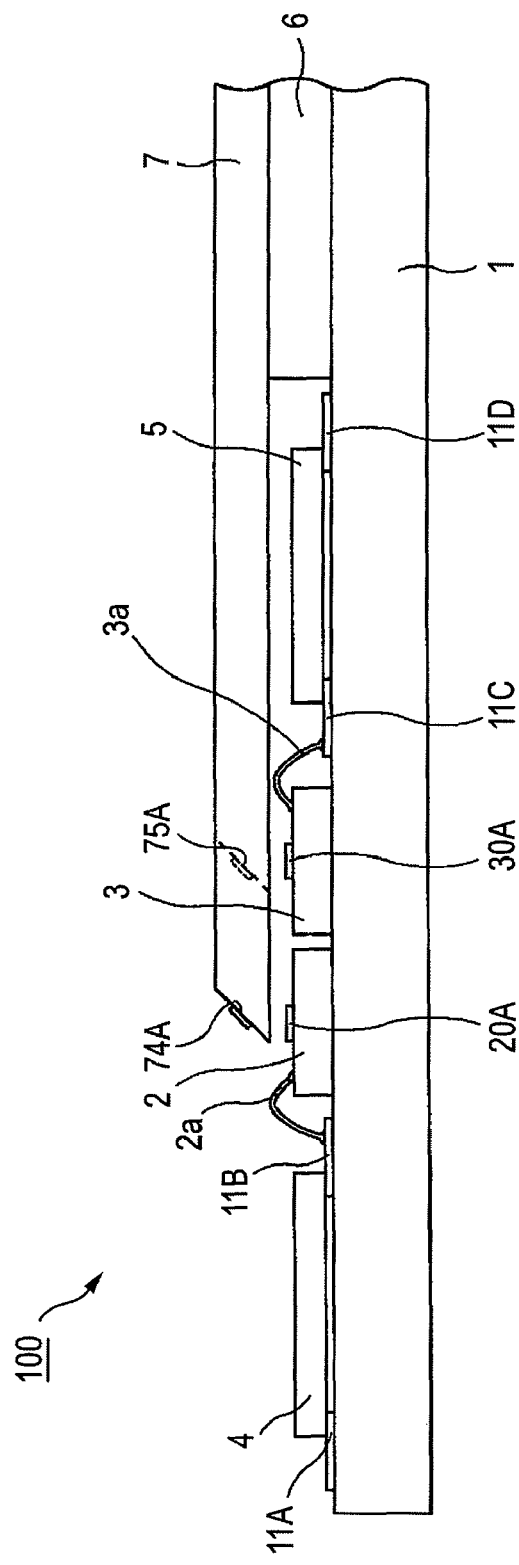
Figure 1B:
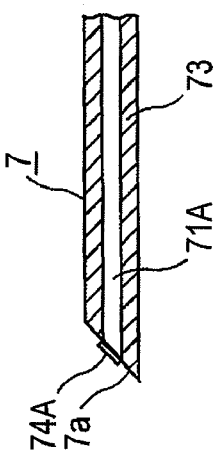
Figure 2:
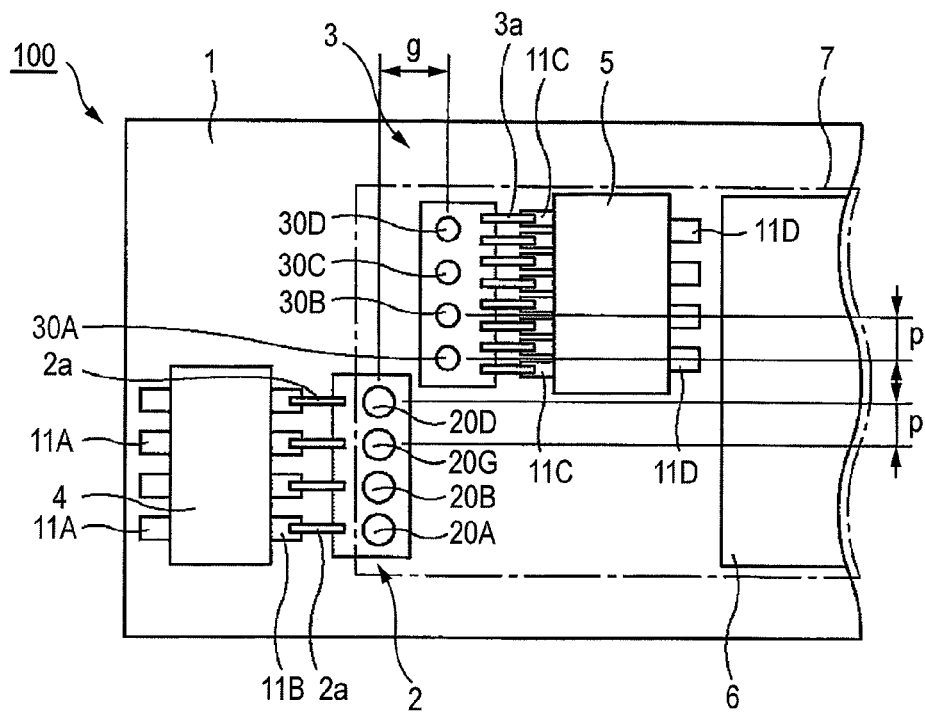
FIG. 2 is a top view illustrating the optical module shown in FIG. 1A.
Figure 3:
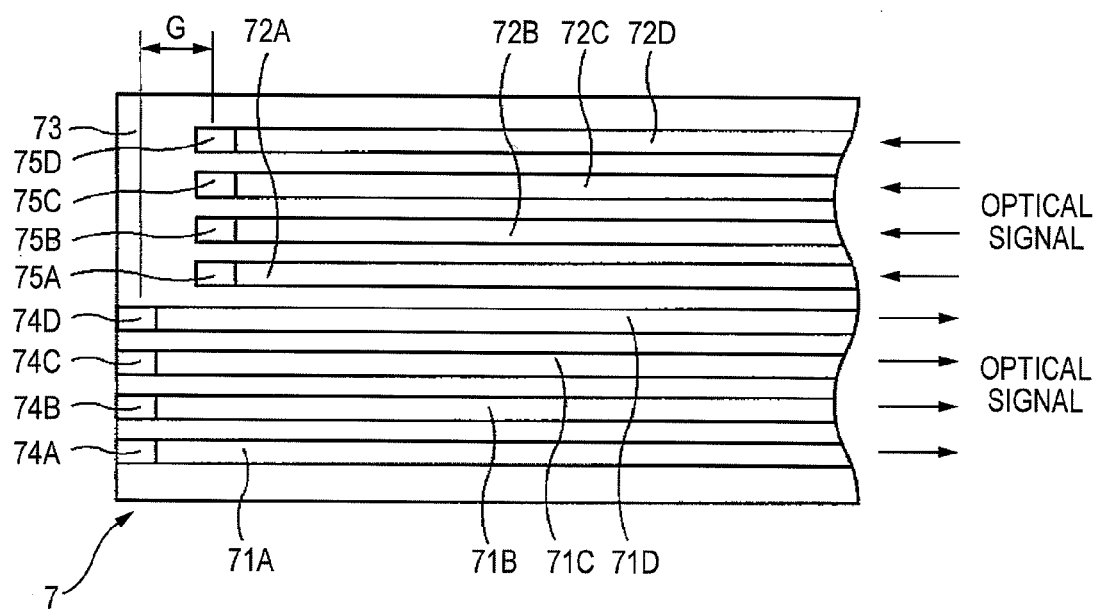
FIG. 3 is a top view illustrating the optical waveguide shown in FIG. 1A.

FIGS. 1A and 1B are diagrams illustrating an optical module according to a first exemplary embodiment of the invention. FIG. 1A is a side view illustrating the optical module and FIG. 1B is a partly expanded view illustrating an optical waveguide. FIG. 2 is a top view illustrating the optical module shown in FIG. 1A. FIG. 3 is a top view illustrating the optical waveguide shown in FIG. 1A.

The optical module 100 has a configuration for converting electric signals of four channels into optical signals to simultaneously transmit the converted optical signals and for simultaneously receiving the optical signals of the four channels to convert the optical signals into the electric signals. In addition, the number of channels is four in this exemplary embodiment, but any number of channels can be set. The same is also applied to the following exemplary embodiments.

As shown in FIGS. 1A, 1B, and 2, the optical module 100 includes a board 1 which is a mounting board for mounting optical elements; a light-emitting element array 2 which is mounted on the board 1; a light-receiving element 3 which is mounted on the board 1 and gets away from the light-emitting element array 2 by a gap g between the light-emitting elements and receiving elements; a driving IC 4 which is electrically connected to the light-emitting element array 2 to be mounted on the board 1; an amplifying IC 5 which is electrically connected to the light-receiving element array 3 and mounted on the board 1; a spacer 6 which is mounted on the board 1; and an optical waveguide 7 which is fixed onto the spacer 6 and includes mirrors 74A to 74D and 75A to 75D as a light path changing portion formed on a 45° inclined surface on each one end thereof.

The board 1, which is made of an epoxy resin, for example, includes electrode pads 11A to 11D connected to the light-emitting element array 2, the light-receiving element array 3, the driving IC 4, and the amplifying IC 5.

(Configuration of Light-Emitting Element Array 2)

The light-emitting element array 2 is composed of four VCSELs (Vertical Cavity Surface Emitting Laser) 20A to 20D for generating modulation light of four channels, for example. In this exemplary embodiment, as shown in FIG. 2, in order to facilitate connection with the driving IC 4, the light-emitting element array 2 is arranged so that an element mount direction thereof is reverse to the element mount direction of the light-receiving element array 3. At this time, the element mount direction refers to a direction of taking out a bonding wire from the light element array. In this exemplary embodiment, the element mount directions of the light-emitting element array 2 and the light-receiving element array 3 are reverse to each other by 180°.

The VCSELs 20A to 20D each include an light-emitting portion having a laminated configuration in which an n-type lower reflector layer, an active layer, a current narrowing layer, a p-type upper reflector layer, a p-type contact layer, and a p-side electrode are laminated on an n-type GsAs board having an n-side electrode on the rear thereof. In addition, each of the p-side electrodes is connected to each of electrode pads 11B of the board 1 by the bonding wire (signal line) 2a.

(Configuration of Light-Receiving Element Array 3)

The light-receiving element array 3 is composed of, for example, four photodiodes (PD) 30A to 30D as a light-receiving element for performing an optical-electric conversion of four channels. In particular, it is preferable to use GaAs series in the PDs 30A to 30D since a high-speed response can be obtained.

As shown in FIG. 2, the light-receiving element array 3 is mounted so that a gap g between the VCSELs 20A to 20D and the PDs 30A to 30D is larger than a pitch p, that is, a relation of g>p is satisfied, assuming that the pitch p is a pitch between the elements in a direction in which the VCSELs 20A to 20D and the PDs 30A to 30D are adjacent to each other.

For example, on the GaAs board, the PD 30A to 30D include a p layer, an I layer, and an N layer, which form PIN junction, a p-side electrode formed on the p layer, and an n-side electrode formed on the N layer. The p-side electrode has an opening, and the inside of the opening is a light-receiving portion for receiving a laser beam. Each p-side electrode and each n-side electrode of the light-receiving element array 3 are connected on each electrode pad 11C of the board 1 by a bonding wire (signal line) 3a.

(Configurations of Driving IC 4, Amplifying IC 5, and Spacer 6)

The driving IC 4 is a driving circuit for performing current-driving of the light-emitting element array 2 on the basis of transmitting data. In this exemplary embodiment, a flat package (FP) type surface-mounting package is used in the driving IC 4.

The amplifying IC 5 is a amplifying circuit which includes transimpedance amplifiers (TIA) (not shown) of four channels for converting current variation of the light-receiving element array 3 into voltage variation and limiting amplifiers (LA) (not shown) of four channels for amplifying and outputting the output voltage of the TIA so as to become predetermined output voltage. In this exemplary embodiment, a flat package (FP) type surface-mounting package is used in the amplifying IC 5.

The spacer 6 positions and fixes the optical waveguide 7 so as to maintain an optical connection distance between the light-emitting element array 2 and the light waveguide 7 and between the light-receiving element array 3 and the light waveguide 7. The spacer 6 is formed of an insulating material board such as an epoxy resin board or a Si board. The spacer 6 is adhered to the optical waveguide 7 by an adhesive, but may be positioned by means of a different supporting adhering way such as fitting.

(Configuration of Optical Waveguide 7)

As shown in FIG. 3, the optical waveguide 7 includes cores 71A to 71D of four channels for transmitting a transmitting optical signal, cores 72A to 72D of four channels for transmitting a receiving optical signal, and a clad 73 for surrounding the cores 71A to 71D and the cores 72A to 72D.

The cores 71A to 71D and the cores 72A to 72D are made of an acrylic resin or an epoxy resin, for example. The clad 73 can be made of a film material which has a refractive index smaller than that of the cores 71A to 71D and the cores 72A to 72D, an optical property such as optical transparency, mechanical strength, heat resistance, flexibility, etc. Examples of the film material include an acrylic resin, a styrene resin, an olefinic resin, and a vinyl chloride series resin.

As shown in FIG. 1B, each one end (front ends) of the cores 71A to 71D and the cores 72A to 72D is formed so as to have a 45° inclined surface. In addition, each of mirrors 74A to 74D and mirrors 75A to 75D is formed on the inclined surface 7a. The mirrors 74A to 74D and the mirrors 75A to 75D are each formed in a manner in which the 45° inclined surface 7a is formed by removing each one end of the cores 71A to 71D and the cores 72A to 72D, and an Au film or the like is deposited on the surface of each one end by electron beams. In addition, the mirrors may be formed by a precision mold. As shown in FIG. 3, a gap G of the mirrors 74A to 74D and the mirrors 75A to 75D is configured so as to be equal to the gap g between the VCSELs 20A to 20D and the PD 30A to 30D.

(Operation of Optical Module 100)

Next, an operation of the optical modules 100 will be described. When a transmitting signal is input to the driving IC 4, a modulation signal is applied to the light-emitting element array 2 in accordance with the transmitting signal, and driving current flows to the VCSELs 20A to 20D. The VCSELs 20A to 20D emit light in accordance with the drive current, and the output light is incident to the mirrors 74A to 74D provided in the cores 71A to 71D of the optical waveguide 7.

The optical signal incident to the mirrors 74A to 74D is incident to the cores 71A to 71D after the optical signal is reflected on the mirrors 74A to 74D and the optical path thereof is changed. The optical signal incident to the cores 71A to 71D propagates through the cores 71A to 71D in the right direction of FIG. 3 and reaches the end of the cores 71A to 71D to be transmitted to a different optical module which is not shown.

On the other hand, when an optical signal is incident to the cores 72A to 72D of the optical waveguide 7, the optical signal propagates through the cores 72A to 72D from the right direction to the left direction of FIG. 3 to be incident to the mirrors 75A to 75D. The optical signal incident to the mirrors 75A to 75D is incident to the PD 30A to 30D after the optical signal is reflected on the mirrors 75A to 75D and the optical path thereof is changed.

The PD 30A to 30D converts the incident optical signal into current. An electric output generated from the PD 30A to 30D is sent to an image processing IC, which is not shown, after the amplifying IC 5 converts the current into voltage to obtain an electric signal and performs predetermined amplifying.

In the first exemplary embodiment, the arrangement of the light-emitting element array 2 and the light-receiving element array 3 is just an example, and the arrangement of light-emitting element array 2 and the light-receiving element array 3 may be changed with each other to be mounted in the board 1.

Second Exemplary Embodiment

Figure 4:
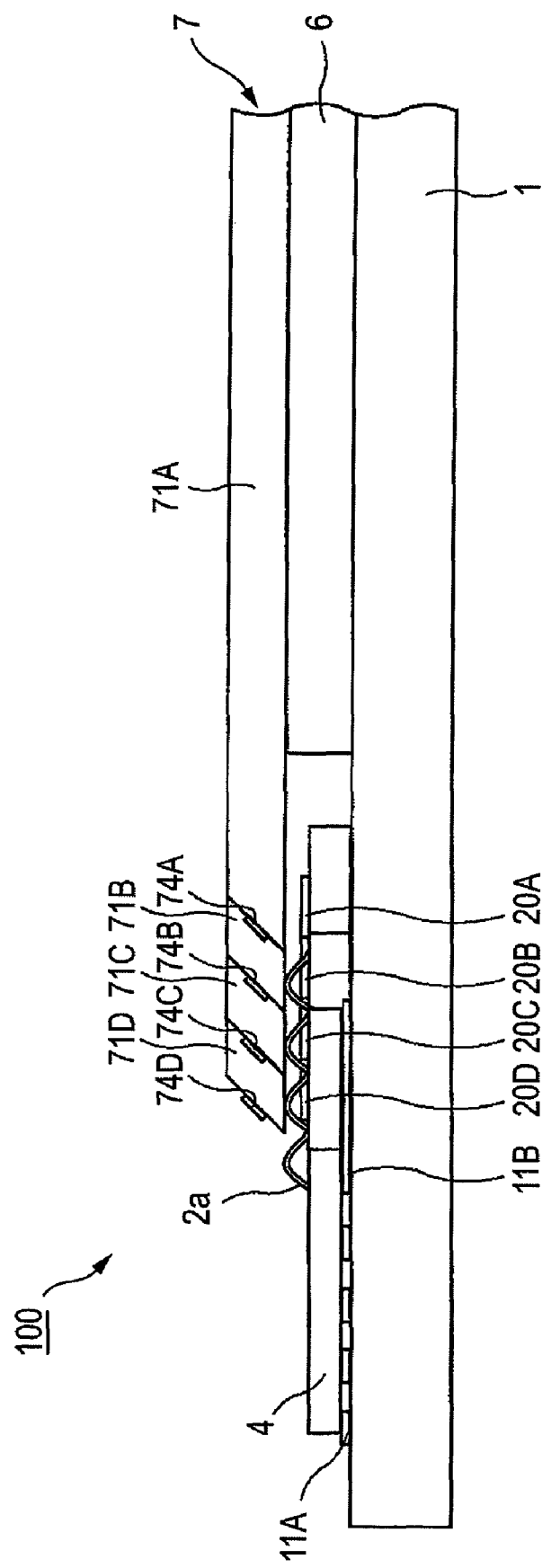
FIG. 4 is a front view illustrating an optical module according to a second exemplary embodiment of the invention.
Figure 5:
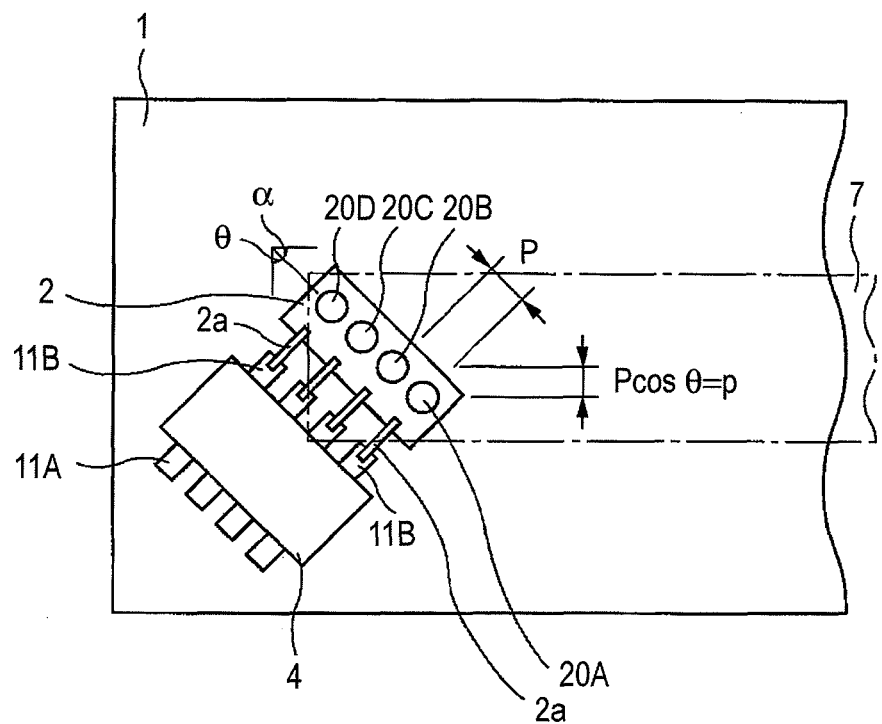
FIG. 5 is a top view illustrating the optical module shown in FIG. 4.

FIG. 4 is a front view illustrating an optical module according to a second exemplary embodiment of the invention. FIG. 5 is a top view illustrating the optical module shown in FIG.

Figure 6:
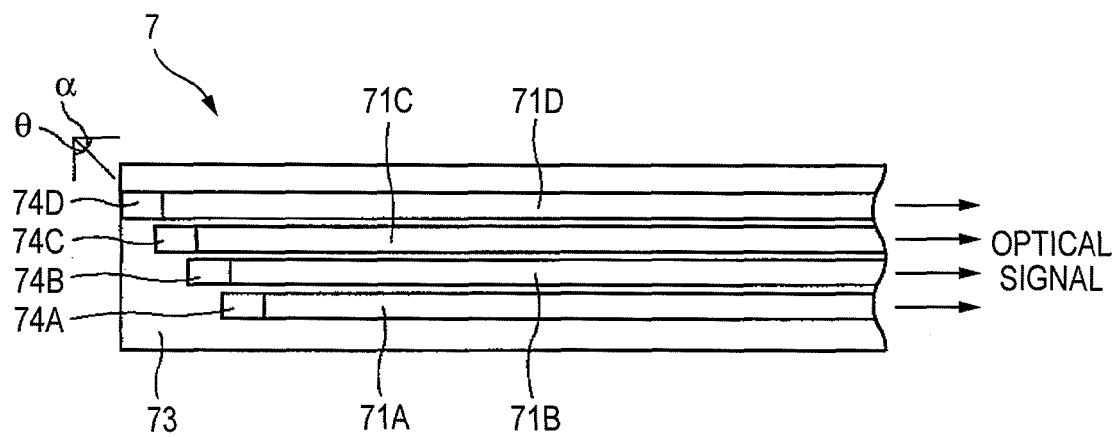
FIG. 6 is a top view illustrating an optical waveguide shown in FIG. 4.

4. FIG. 6 is a top view illustrating an optical waveguide shown in FIG. 4. In addition, in FIGS. 4 to 6, a configuration of a light-receiving side is now shown.

In this exemplary embodiment, the VCSELs 20A to 20D of the light-emitting element array 2 according to the first exemplary embodiment are disposed at a predetermined angle θ (for example, 45°) with respect to a direction in which the cores 71A to 71D of the optical waveguide 7 are formed. In addition, the rest configuration is the same as that according to the first exemplary embodiment.

As shown in FIG. 5, the VCSELs 20A to 20D are disposed at the angle θ with respect to the end surface of the optical waveguide 7 and at an angle α with respect to the direction in which the cores 71A to 71D and the cores 72A to 72D are formed. A pitch p of the cores 71A to 71D of the optical waveguide 7 satisfies a relation of p=P cosθ for a pitch P between the VCSELs 20A to 20D. That is, the pitch p between the cores 71A to 71D is narrower than the pitch P of the VCSELs 20A to 20D.

In the second exemplary embodiment, the light-emitting element array 2 may be configured in place of the light-receiving element array 3. Moreover, a light-receiving element array 3 and the corresponding cores may be added to the configuration shown in FIG. 5. Moreover, a plurality of the light-emitting element arrays 2 may be configured.

Third Exemplary Embodiment

Figure 7:
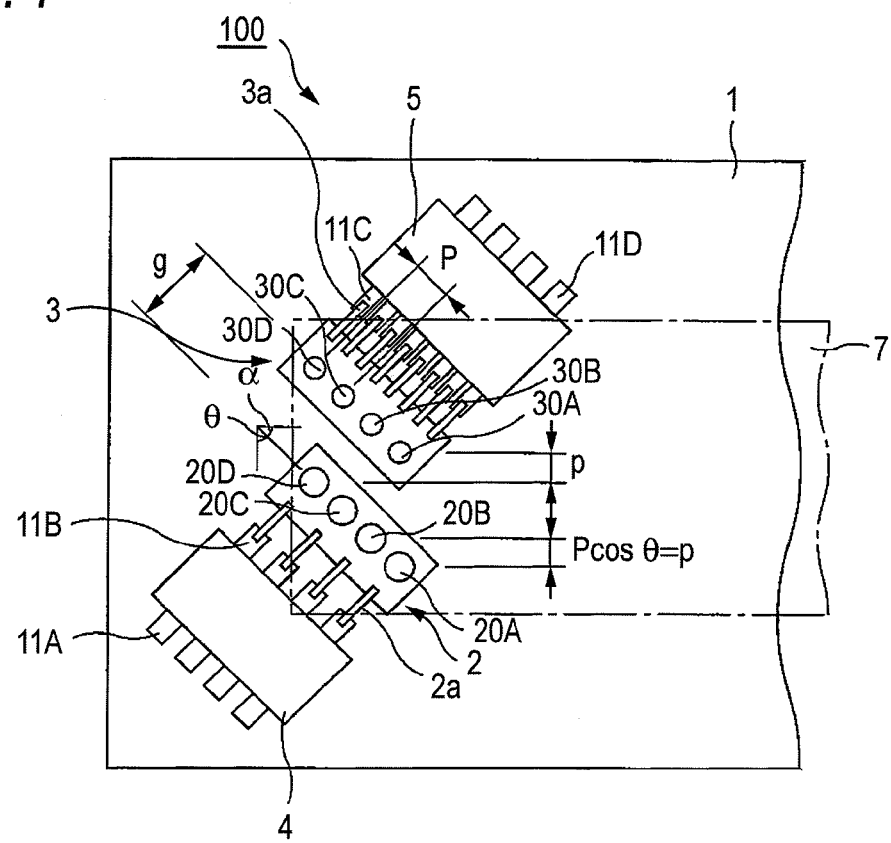
FIG. 7 is a top view illustrating a configuration of an optical module according to a third exemplary embodiment of the invention.
Figure 8:
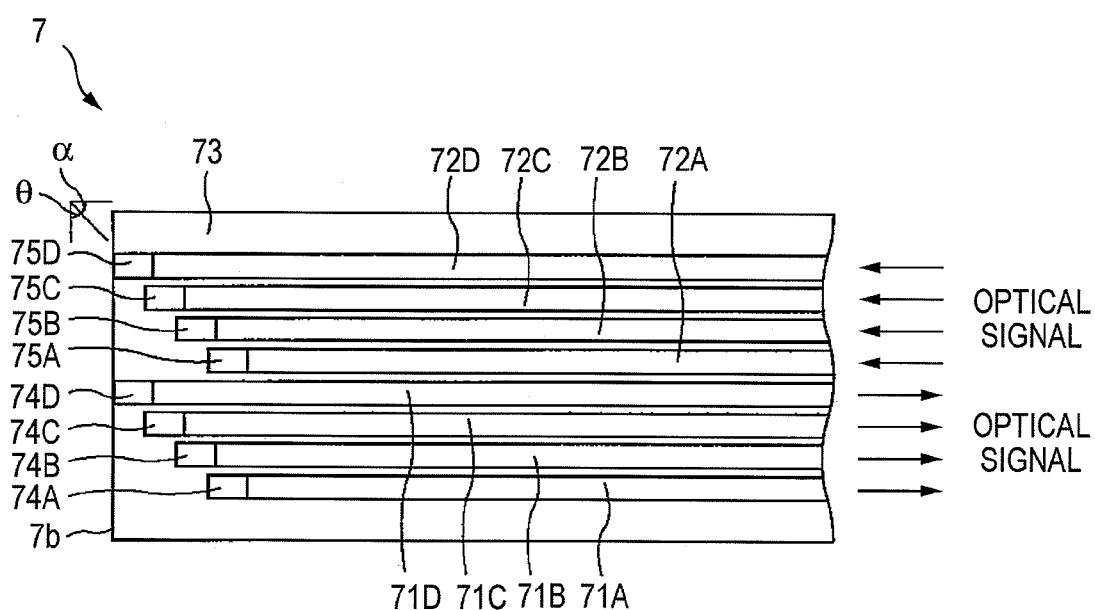
FIG. 8 is a top view illustrating an optical waveguide of the optical module according to the third exemplary embodiment.

FIG. 7 is a top view illustrating a configuration of an optical module according to a third exemplary embodiment of the invention. FIG. 8 is a top view illustrating an optical waveguide of the optical module according to the third exemplary embodiment.

In this exemplary embodiment, the light-emitting element array 2 and the light-receiving element array 3 according to the first exemplary embodiment are disposed at an angle θ with respect to the end surface of the cores 71A to 71D and the cores 72A to 72D of the optical waveguide 7 and are disposed at an angle α with respect to a direction in which the cores 71A to 71D and the cores 72A to 72D are formed, in the same manner as that according to the second exemplary embodiment. In FIG. 7, the spacer described in the first exemplary embodiment is not shown. Likewise, the optical waveguide 7 is configured in a manner in which mirrors 74A to 74D and mirrors 75A to 75D are provided so that each end surface of the cores 71A to 71D and each end surface of the cores 72A to 72D are disposed at the angle θ with respect to the end surface 7b of the optical waveguide 7 and the two optical waveguide 7 according to the second exemplary embodiment are arranged in parallel with each other which is shown in FIG. 6.

As shown in FIG. 7, the driving IC 4 and the amplifying IC 5 are arranged more outside than the light-emitting element array 2 and the light-receiving element array 3, so that the light-emitting element array 2 and the light-receiving element array 3 are approximated to each other and the mirrors 74A to 74D and the mirrors 75A to 75D shown in FIG. 8 get together in the end of the optical waveguide 7. A gap g between the VCSELs 20A to 20D and the PDs 30A to 30D is larger than the pitch P, that is, a relation of g>P is satisfied.

Fourth Exemplary Embodiment

Figure 9:
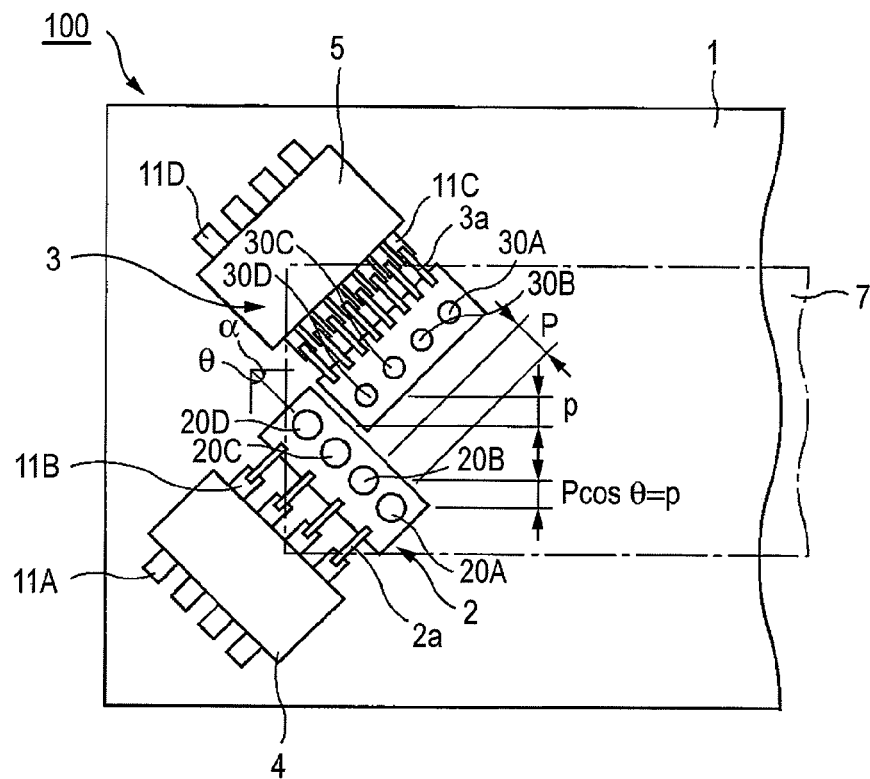
FIG. 9 is a top view illustrating a configuration of an optical module according to a fourth exemplary embodiment of the invention.
Figure 10:
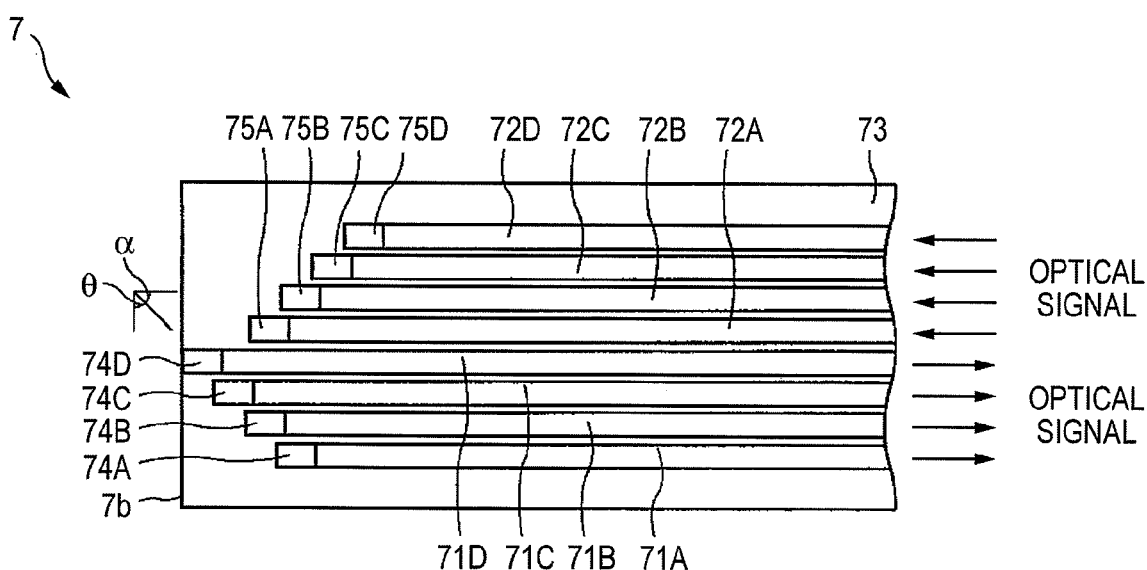
FIG. 10 is a top view illustrating an optical waveguide of the optical module according to the fourth exemplary embodiment.

FIG. 9 is a top view illustrating a configuration of an optical module according to a fourth exemplary embodiment of the invention. FIG. 10 is a top view illustrating an optical waveguide of the optical module according to the fourth exemplary embodiment.

In this exemplary embodiment, the light-receiving element array 3 according to the third exemplary embodiment rotates by 90° to be mounted so that PDs 30A to 30D of the light-receiving element array 3 is disposed at right angles with respect to a direction in which VCSELs 20A to 20D of the light-emitting element array 2 are arranged. Mirrors 74A to 74D and mirrors 75A to 75D of the optical waveguide 7 are arranged in accordance with the arrangement of the light-emitting element array 2 and the light-receiving element array 3. The rest configuration is the same as that according to the third exemplary embodiment.

In this case, the light-receiving element array 3 is disposed so that the cores 71A to 71D and the cores 72A to 72D of the optical waveguide 7 have the same pitch and the PDs 30A to 30D have the same pitch p as that of the VCSELs 20A to 20D.

In the fourth exemplary embodiment, the mirrors 74A to 74D and the mirrors 75A to 75D of the optical waveguide 7 may be arranged in a V shape. In this case, the light-emitting element array 2 and the light-receiving element array 3 are arranged so that the VCSELs 20A to 20D and the PDs 30A to 30D shown in FIG. 9 are formed in a V shape.

Fifth Exemplary Embodiment

Figure 11:
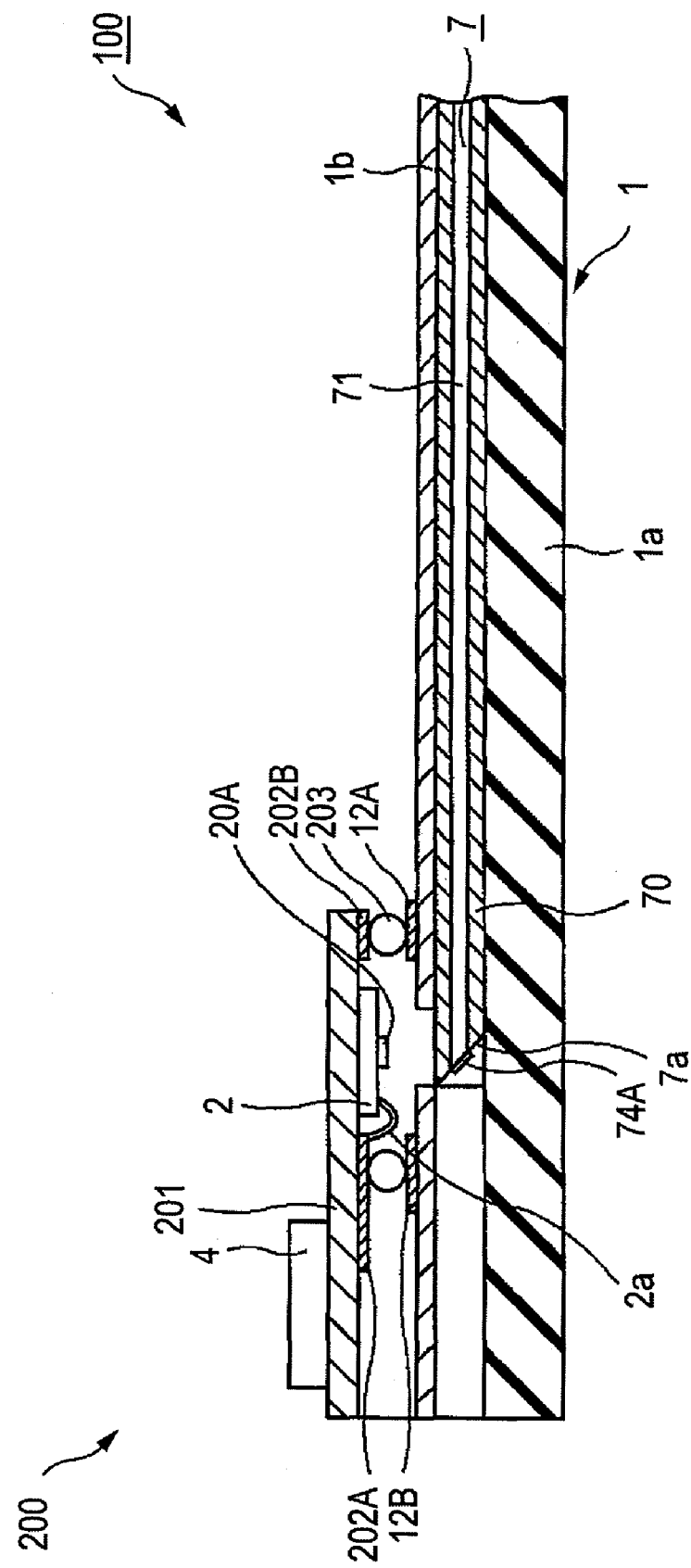
FIG. 11 is a sectional view illustrating an optical module according to a fifth exemplary embodiment of the invention.

FIG. 11 is a sectional view illustrating an optical module according to a fifth exemplary embodiment of the invention.

In this exemplary embodiment, the optical waveguide 7 according to the first exemplary embodiment is disposed on the board 1 and the spacer 6 is removed. In addition, the light-emitting element array 2 is mounted as an optical wiring of the board in a face-down manner. The rest configuration is the same as that according to the first exemplary embodiment. Moreover, the fifth exemplary embodiment may be also applied to the second to fourth exemplary embodiments.

An optical module 100 includes the board 1 on which the optical waveguide 7 is mounted and a light-emitting unit 200 mounted on the board 1.

The board 1 includes an insulating layer 1a; a clad portion 70 which is formed on the insulating layer 1a and on which the optical waveguide 7 is formed; a core portion 71 of which a refractive index is larger than that of the clad portion 70; and a wiring layer 1b which is formed on the upper surface of the waveguide 7 and on which electrode pads 12A and 12B are provided.

Like the description according to the first exemplary embodiment, in the optical waveguide 7 according to the this exemplary embodiment, cores 71A to 71D are formed on the clad portion 70 and mirrors 74A to 74D are each formed on an inclined surface 7a formed on each one end of the cores 71A and 71D. A translucent resin material having the same refractive index as that of the clad portion 70 fills up portions of each inclined surface 7a and the mirrors 74A to 74D.

The light-emitting unit 200 includes a wiring board 201 with electrode pads 202A and 202B on the rear surface thereof; solder balls 203 mounted on the electrode pads 202A and 202B, a light-emitting element array 2 mounted on the rear surface of the wiring board 201; and a driving IC 4 mounted on the surface of the wiring board 201.

Other Exemplary Embodiments

The invention is not limited to the above-described exemplary embodiments, but may be modified in various forms within the scope of the invention without departing the gist of the invention. For example, in the first, third, and fourth exemplary embodiments, only one of the light-emitting side and the light-receiving side may be configured.

In the above-described exemplary embodiments, the board 1 may include cores 75A to 75D of four channels for receiving light in addition to the cores 74A to 74D of four channels for transmitting light. Moreover, the electric wiring layer for transmitting the electric signal may be configured as a multilayer.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An optical module comprising:
   a driving integrated circuit (IC);
   an amplifying IC;
   a light-emitting element array comprising a plurality of light-emitting elements;
   a light-receiving element array comprising a plurality of light-receiving elements; and
   an optical waveguide comprising a clad and a plurality of cores respectively with optical path changing portions, the cores being disposed in the clad with an interval,
   wherein said plurality of optical path changing portions are optically connected to said plurality of light-emitting elements and said plurality of light-receiving elements,
   the light-emitting element array and the light-receiving element array are respectively formed at first and second oblique angles with respect to a formation direction of the cores,
   said plurality of optical path changing portions are provided with the cores in accordance with an arrangement of the light-emitting element array and the light-receiving element array,
   the light-emitting elements do not overlap the light-receiving elements in a formation direction of the cores, and
   the driving IC and the amplifying IC are not disposed between the light-emitting element array and the light-receiving element array.

2. The optical module according to claim 1, further comprising a board for mounting an array-shaped device,
   wherein the optical waveguide is incorporated in the board.

3. The optical module according to claim 1, wherein the light-emitting element array is further formed at an oblique angle to an end surface of the waveguide.

4. An optical module comprising:
   a driving integrated circuit (IC);
   an amplifying IC;
   a light-emitting element array comprising a plurality of light-emitting elements;
   a light-receiving element array comprising a plurality of light-receiving elements; and
   an optical waveguide comprising a clad and a plurality of cores respectively with optical path changing portions, the cores being disposed in the clad with an interval,
   wherein said plurality of optical path changing portions are optically connected to said plurality of light-emitting elements and said plurality of light-receiving elements,
   the light-emitting element array and the light-receiving element array are respectively formed at first and second angles with respect to a formation direction of the cores and
   said plurality of optical path changing portions are provided with the cores in accordance with an arrangement of the light-emitting element array and the light-receiving element array,
   said plurality of light-emitting elements and said plurality of light-receiving elements are arranged with a gap, which is larger than a pitch between the light-receiving and light-emitting elements,
   the light-emitting element array and the light-receiving element array are opposed to each other,
   in the optical waveguide, said plurality of optical path changing portions are arranged so that the first angle is the same as the second angle,
   the light-emitting elements do not overlap the light-receiving elements in a formation direction of the cores,
   the driving IC and the amplifying IC are not disposed between the light-emitting element array and the light-receiving element array, and
   the driving IC is disposed on an opposed side to the amplifying IC with respect to the gap.

5. An optical module comprising:
   a driving integrated circuit (IC);
   an amplifying IC;
   a light-emitting element array comprising a plurality of light-emitting elements;
   a light-receiving element array comprising a plurality of light-receiving elements;
   an optical waveguide comprising a clad and a plurality of cores respectively with optical path changing portions, the cores being disposed in the clad with an interval,
   wherein said plurality of optical path changing portions are optically connected to said plurality of light-emitting elements and said plurality of light-receiving elements,
   the light-emitting element array and the light-receiving element array are respectively formed at first and second angles with respect to a formation direction of the cores,
   said plurality of optical path changing portions are provided with the cores in accordance with an arrangement of the light-emitting element array and the light-receiving element array,
   the light-emitting element array and the light-receiving element array are arranged so that an element arrangement direction of the light-emitting element array and an element arrangement direction of the light-receiving element array are perpendicular to each other,
   said plurality of optical path changing portions are provided with the cores in accordance with the element arrangement directions of the light-emitting element array and the light-receiving element array,
   the light-emitting elements do not overlap the light-receiving elements in a formation direction of the cores, and
   the driving IC and the amplifying IC are not disposed between the light-emitting element array and the light-receiving element array.

* * * * *